United States Patent
Tsao et al.

(10) Patent No.: US 7,015,066 B2
(45) Date of Patent: Mar. 21, 2006

(54) METHOD FOR STRESS REDUCTION IN FLIP CHIP BUMP DURING FLIP CHIP MOUNTING AND UNDERFILL PROCESS STEPS OF MAKING A MICROELECTRONIC ASSEMBLY

(75) Inventors: Pei-Haw Tsao, Taichung (TW); Chender Huang, Hsin-Chu (TW); Jones Wang, Jung-He (TW); Ken Chen, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 329 days.

(21) Appl. No.: 09/946,995

(22) Filed: Sep. 5, 2001

(65) Prior Publication Data

US 2003/0045028 A1 Mar. 6, 2003

(51) Int. Cl.
*H01L 21/44* (2006.01)
*H01L 21/48* (2006.01)
*H01L 21/50* (2006.01)
*H01L 21/00* (2006.01)
*H01L 21/64* (2006.01)

(52) U.S. Cl. .................. 438/108; 438/117; 438/615; 29/760; 29/25.01; 228/44.7; 228/49.5; 269/104; 269/119; 269/246; 269/305; 269/315; 269/118; 269/903

(58) Field of Classification Search ............. 269/104, 269/119, 121, 246, 305, 903, 315, 118; 29/760, 29/25.01; 228/44.7, 49.5; 438/108, 117, 438/615
See application file for complete search history.

(56) References Cited

U.S. PATENT DOCUMENTS

| | | | | |
|---|---|---|---|---|
| 255,069 A | * | 3/1882 | Woodford | 269/118 |
| 1,150,962 A | * | 8/1915 | Pederson | 269/128 |
| 1,168,147 A | * | 1/1916 | Bender | 249/48 |
| 1,194,666 A | * | 8/1916 | Romanowski | 269/110 |
| 1,841,196 A | * | 1/1932 | Mass | 269/104 |
| 3,392,972 A | * | 7/1968 | Wing | 269/87.2 |
| 3,395,439 A | * | 8/1968 | Palesi et al. | 269/296 |
| 3,593,984 A | * | 7/1971 | Carman et al. | 269/1 |
| 3,633,102 A | * | 1/1972 | Heather | 324/537 |
| 3,775,644 A | * | 11/1973 | Cotner et al. | 361/769 |
| 4,582,309 A | * | 4/1986 | Moxon et al. | 269/303 |
| 4,619,448 A | * | 10/1986 | Leibinger et al. | 269/303 |
| 4,621,797 A | * | 11/1986 | Ziegenfuss | 269/34 |
| 4,704,319 A | * | 11/1987 | Belanger et al. | 428/209 |
| 4,759,488 A | * | 7/1988 | Robinson et al. | 228/43 |
| 4,775,135 A | * | 10/1988 | Leibinger et al. | 269/303 |
| 4,784,377 A | * | 11/1988 | Woodward | 269/21 |
| 4,855,559 A | * | 8/1989 | Donner | 219/85.16 |
| 4,998,712 A | * | 3/1991 | Park et al. | 269/25 |
| 4,999,311 A | * | 3/1991 | Dzarnoski, Jr. et al. | 438/109 |
| 5,067,433 A | * | 11/1991 | Doll et al. | 118/500 |

(Continued)

*Primary Examiner*—David E. Graybill
(74) *Attorney, Agent, or Firm*—Tung & Assoc.

(57) ABSTRACT

A method of making a microelectronic assembly buying restraining a substrate in a fixture at room temperature, placing a flip chip on the substrate so that conductive bumps on the flip chip are aligned with contact pads on the substrate, heating the flip chip, the substrate and the fixture to reflow the conductive bumps on the flip chip, cooling the flip chip, substrate and fixture to solidify the conductive bumps and to mount the flip chip to the substrate, depositing an underfill between the flip chip and the substrate, curing the underfill by heating the flip chip, substrate, underfill and fixture to an elevated temperature, and removing the flip chip mounted substrate from the fixture.

13 Claims, 3 Drawing Sheets

U.S. PATENT DOCUMENTS

| | | | | |
|---|---|---|---|---|
| 5,067,648 A | * | 11/1991 | Cascini | 228/47.1 |
| 5,161,789 A | * | 11/1992 | Rogers | 269/42 |
| 5,307,977 A | * | 5/1994 | Park | 228/4.5 |
| 5,456,402 A | * | 10/1995 | Curtin | 228/43 |
| 5,501,436 A | * | 3/1996 | Miller | 269/47 |
| 5,621,615 A | | 4/1997 | Dawson et al. | |
| 5,723,369 A | | 3/1998 | Barber | |
| 5,726,079 A | | 3/1998 | Johnson | |
| 5,785,307 A | * | 7/1998 | Chung | 269/254 CS |
| 5,816,568 A | * | 10/1998 | Fox | 269/60 |
| 5,883,430 A | | 3/1999 | Johnson | |
| 5,889,332 A | * | 3/1999 | Lawson et al. | 257/778 |
| 5,907,786 A | | 5/1999 | Shinomiya | |
| 5,990,565 A | | 11/1999 | Chang | |
| 6,018,196 A | | 1/2000 | Noddin | |
| 6,043,429 A | | 3/2000 | Blish, II et al. | |
| D426,524 S | * | 6/2000 | Abed et al. | D13/199 |
| 6,104,093 A | | 8/2000 | Caletka et al. | |
| 6,164,636 A | * | 12/2000 | Taylor | 269/287 |
| 6,190,997 B1 | * | 2/2001 | Becker et al. | 438/401 |
| 6,191,952 B1 | * | 2/2001 | Jimarez et al. | 361/771 |
| 6,209,859 B1 | * | 4/2001 | Chung | 269/111 |
| 6,237,832 B1 | * | 5/2001 | Chung | 228/44.7 |
| 6,278,180 B1 | * | 8/2001 | Mizushima et al. | 257/700 |
| 6,279,815 B1 | * | 8/2001 | Correia et al. | 228/180.21 |
| 6,310,403 B1 | * | 10/2001 | Zhang et al. | 257/786 |
| 6,317,331 B1 | * | 11/2001 | Kamath et al. | 361/760 |
| 6,378,857 B1 | * | 4/2002 | Taylor | 269/47 |
| 6,443,179 B1 | * | 9/2002 | Benavides et al. | 137/454.2 |
| 6,450,491 B1 | * | 9/2002 | McEvoy | 269/118 |
| 6,524,351 B1 | * | 2/2003 | Ohta | 29/25.01 |
| 6,528,179 B1 | * | 3/2003 | Jimarez et al. | 428/620 |
| 2001/0013392 A1 | * | 8/2001 | Carden et al. | 156/329 |
| 2001/0015010 A1 | * | 8/2001 | Tsukamoto | 29/846 |
| 2003/0034566 A1 | * | 2/2003 | Jimarez et al. | 257/778 |
| 2003/0146268 A1 | * | 8/2003 | Hofstee et al. | 228/180.22 |

* cited by examiner

METHOD FOR STRESS REDUCTION IN FLIP CHIP BUMP DURING FLIP CHIP MOUNTING AND UNDERFILL PROCESS STEPS OF MAKING A MICROELECTRONIC ASSEMBLY

FIELD OF THE INVENTION

This invention relates to microelectronic assemblies and methods of making the same, and more particularly to a method for reducing thermal-mechanical stresses induced in a flip chip bump during flip chip mounting and underfill process steps of making a microelectronic assembly.

BACKGROUND OF THE INVENTION

The primary role of packaging in semiconductor electronic applications or microelectronic assemblies is to protect and preserve the performance of the semiconductor device from electrical, mechanical, and chemical corruption or impairment. The traditional packaging technology that has supported device protection and performance requirements include such structures as the dual in-line package and the quad flat package. More than 97 percent of current commercial semiconductor products presently use these formats. Typically in these applications, an integrated circuit chip is electronically connected to the package via wire bonding. The dual in-line package uses pins to connect the package chip to the electronic system, and these pins are inserted into a printed circuit board or socket assembly. Leads of the quad flat package, however, are solder mounted to the surface of the printed circuit board rather than being inserted into the board as is the case with the dual in-line package. This system of surface mount technology can support many more packages to board leads than can the dual in-line package. However, at a certain point, currently at approximately 250 leads, the increased difficulty in manufacturing the quad flat package format reaches a practical limit to further extension of higher lead counts. Accordingly, the commercial industry is moving away from these types of packages and to alternative package arrangements, particularly using flip chip packages.

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with the wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach," because the chip is directly attached to the substrate, board, or carrier by the conductive bumps.

The use of flip chip packaging has dramatically grown as a result of the flip chips advantages in size, performance and flexibility over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulting in a high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips can be combined with a variety of packages. The ball grid array is one particular package which has gained significant popularity for use with the flip chip. The ball grid array package construction is significantly different from conventional leaded packages in several ways. Typically the ball grid array uses a resin based organic substrate (first substrate) onto which the flip chip die and solder balls are attached. The substrate incorporates metalized trace routing for connection from the die to a second substrate, such as a system board. The connection made to the second substrate is through solder balls on the underside of the first substrate. Ball grid array packages provided numerous advantages over conventional leaded packages such as: improved electrical performance due to shorter distances between the chip and the solder balls; improved thermal performance by use of thermal vias or heat dissipation through power and ground planes incorporated into the second substrate (e.g., main PC board); using less real estate on the underlying system board or second substrate; significantly reducing handling related lead damage due to use of solder balls instead of metal leads; and when the ball grid array is reflow attached to boards, the solder balls self align leading to higher manufacturing yields.

Despite all of these advantages, these microelectronic assemblies are very delicate structures, the design of which and manufacturing creates difficult and unique technical problems. Continuous efforts by those working in the art are being undertaken to improve the performance, reliability and useful life of microelectronic assemblies, particularly those using flip chips. The following is a description of some of the problems facing those skilled in the art.

Typically a flip chip will be mounted and electrically connected to a supporting substrate such as a ball grid array. The supporting substrate may be secured to a printed circuit board. The flip chip can generate a considerable amount of heat during operation which may range from about 25 to 100 watts concentrated in the area the chip which usually ranges from 1 to 4 cubic centimeters. Those working in the art are constantly seeking ways to control and manage this concentrated heat generation to avoid failure of the microelectronic device due to overheating.

Failure to manage the heat generated by the flip chip may be very costly. The heat generated from the flip chip during operation may cause the chip dimensions to change and may result in damage to signals generated by the chip. Furthermore, thermal expansion may cause the chip to curve, bend or crack. These distortions in the chip may result in damage to the electrical connections between the chip and the substrate.

Furthermore, the substrate onto which the flip chip may be mounted can be a single layer structure, or the substrate may comprise two or many more layers of materials. Often these materials tend to be quite diverse in their composition and structure. The coefficient of thermal expansion for these different layers may be considerably different and may result in uncontrolled bending or thermal induced substrate surface distortions. Such distortions can cause failure of the flip chip or other components of the substrate.

In addition to chip warpage (or warping) due to thermal effects, chip or substrate warpage may be caused by other steps of the manufacturing process. For example, chip warpage may occur as a consequence of the chip underfill process. Typically, an adhesive underfill is applied between the opposing faces of the chip and the underlying substrate to secure the chip to the substrate and to secure the electrical connections, usually solder joints, between the chip and the substrate. When the adhesive underfill is cured or hardened, the cured adhesive tends to shrink placing the solder joints in a compressed state, and often the shrinking adhesive causes warpage of the substrate.

The use of underfills and ball grid array (BGA) have played a significant factor in the viability of flip chips. As indicated earlier, a BGA is a high-density integrated circuit surface mount package with an area array of conductive bumps or solder balls for interconnection to a substrate. The coefficient of thermal expansion (CTE) of silicon is about 2.6 ppm/° C., and that of glass fiber reinforced printed wiring board or printed circuit board (PCB) is about 17 ppm/° C. The ball grid array (BGA) substrate is the intermediary between the silicon and the PCB with a CTE of 6 ppm/° C. for ceramic BGA, and 17 ppm/° C. for organic BGA. The larger CTE difference between the BGA and the silicon chip puts a significant sheer stress on the flip chip interconnection. The use of underfills between the front side of the chip and the top side of the printed circuit board BGA substrate distributes the stress over the entire surface of the integrated circuit chip, thus reducing the stress on the flip chip solder joints. The impact of this CTE mismatch is that the entire assembly flexes during thermal cycling to distribute away the stresses from the solder balls.

FIG. 1 illustrates a flip chip BGA assembly that includes a semiconductor integrated circuit chip 10 having a top face 12 that is positioned face down towards a top face 13 of an underlying first substrate 14. A first set of electrically conductive bumps, preferably solder bumps, 16 connect the integrated circuit chip 10 to the first substrate 14. A bottom face 18 of the first substrate 14 has a second set of electrically conductive bumps, preferably solder bumps, 20 that are connected to contact pads (not shown) on a top first surface 24 of an underlying second substrate 22. As will be appreciated from FIG. 1, the second set of electrically conductive bumps or solder bumps 20 may be fully arrayed across the entire surface of the bottom face 18 of the first substrate. The second substrate 22 may be a printed wiring board (also known as a printed circuit board). Typically an underfill 21 is provided between the top face 12 of the integrated flip chip 10 and the top face 13 of the first substrate 14. The underfill encapsulant 21 also helps to reduce the effect of the global thermal expansion mismatch between the flip chip 10 and the first substrate 14 of the BGA. The underfill typically has a low thermal coefficient of expansion which helps to reduce the thermal expansion mismatch between the flip chip 10, solder bumps 16, and the first substrate 14. Other advantages of the underfill encapsulant are that it protects the chip from moisture, ionic contaminants, radiation, and hostile operating environments such as thermal and mechanical conditions, shock, and vibration. The underfill may also act as a heat sink, providing a major heat path between the flip chip 10 and the underlying first substrate 14 of the BGA. As shown in FIG. 1, the first set of electrically conductive bumps or solder bumps 16 are positioned across substantially the entire top face 12 of the integrated circuit chip and is thus known as a fully arrayed integrated circuit flip chip. In certain situations, fully arrayed integrated circuit chips are disadvantageous because they utilize more package substrate layers needed for input/output trace routing and have an associated increased substrate cost, as well as assembly costs.

FIG. 2 illustrates a flip chip BGA assembly similar to that shown in FIG. 1, however, the first set of electrically conductive bumps or solder bumps 16 are not fully arrayed, but are positioned along the periphery 28 of the integrated circuit chip 10. Because the flip chip is bumped along the periphery 28, a gap 30 in the positioning of the bumps 16 is provided along the sides and center of the flip chip. Likewise, the second set of electrically conductive bumps or solder bumps 20 are secured to the periphery 32 of the bottom face 18 of the first substrate 14. Similarly, a gap 34 in the positioning of the bumps 20 is provided along the sides and center of the bottom face 18 of the first substrate 14. Periphery mounted bump flip chips are much less expensive to manufacture than fully arrayed flip chip microelectronic assemblies. However, during the flip chip mounting process, the electrically conductive bumps or solder bumps 16 are reflown at elevated temperatures (above room temperature) to reflow the solder and mechanically attach the flip chip to contact pads (not shown) on the top face 13 of the first substrate 14. Further, typically an underfill is flown into the cavity between the top face 12 of the integrated circuit chip 10 and the top face 13 of the first substrate 14. The underfill material is typically cured at elevated temperatures (above room temperature). The flip chip mounting process and the underfill curing process each induce thermal-mechanical stresses in the bump joints due to the mismatch between the thermal expansion coefficient of the integrated circuit chip 10 and the first substrate 14. Still further, during operation of the integrated circuit chip, and thermal cycling, substantial thermal-mechanical stresses may be applied to the solder bumps 16 of the flip chip. Thus, it would be desirable to provide a method of flip chip mounting and underfill curing that reduced or accommodated thermal-mechanical stresses ordinarily associated with such processes. Furthermore, it would be desirable to provide a microelectronic assembly and method of manufacturing the same that would reduce or accommodate thermo-mechanical stresses induced during thermal cycling under normal operation of the microelectronic assembly.

The present invention satisfies an existing need and provides improvements, and alternatives to the prior.

SUMMARY OF THE INVENTION

The present invention includes a prestressed microelectronic assembly including a flip chip mounted on a first substrate. The first substrate has induced stresses that are the opposite of those that the substrate would expect to be subjected to during the flip chip mounting, underfill curing, or thermal cycling during normal operation of the microelectronic assembly.

One embodiment of the invention includes a method including the steps of providing a first substrate having a top face, opposite bottom face, and a plurality of sides, and contact elements formed on the top face of the first substrate, restraining the first substrate in a fixture at room temperature, and wherein the fixture engages the sides of the first substrate, placing a flip chip on the first substrate so that electrically conductive bumps on the flip chip are aligned with the contact pads on the first substrate, heating the flip chip, first substrate and the fixture to reflow the electrically conductive bumps on the flip chip, cooling the flip chip, first substrate and fixture to solidify the electrically conductive bumps and to mount the flip chip to the first substrate, and removing the flip chip mounted substrate from the fixture.

In another embodiment of the present invention, the electrically conductive bumps include solder.

In another embodiment of the present invention, the flip chip, first substrate and fixture are heated to greater than 200° C. to reflow the electrically conductive bumps.

Another embodiment of the present invention further includes the step of depositing an underfill between the flip chip and the first substrate, and curing the underfill.

In another embodiment of the present invention, the step of curing the underfill comprises heating the underfill to an elevated temperature.

In another embodiment of the present invention, the step of curing the underfill comprises heating the underfill to a temperature ranging from 120–180° C.

In another embodiment of the present invention, the fixture is a metal.

In another embodiment of the present invention, the fixture has a coefficient of thermal expansion ranging from 4–10 ppm/° C.

In another embodiment of the present invention, the fixture includes a plurality of substrate restraining members each for engaging one of the sides of the first substrate, and wherein the plurality of restraining members each have a coefficient of thermal expansion ranging from 4–10 ppm/° C.

In another embodiment of the present invention, the plurality of restraining members are made from a metal.

In another embodiment of the present invention, the plurality of restraining members include a first and second elongated stationary stop and first and second movable clamps.

In another embodiment of the present invention, the fixture further includes a substrate carrying member for supporting the first substrate along the bottom face.

In another embodiment of the present invention each of the restraining members each engage one of the sides along substantially the entire length of the side.

In another embodiment of the present invention the first and second elongated stops are formed at right angles to each other.

In another embodiment of the present invention the fixture further includes a substrate fixture base having first and second threaded holes formed therethrough, a screw is received in each of the holes and the screw has one end connected to one of the movable clamps and constructed and arranged so that tightening the screw causes the movable clamp to engage a side of the first substrate.

In another embodiment of the present invention the fixture further includes a clamp guide plate overlying each of the first and second movable clamps.

Another embodiment of the present invention includes a method including the steps of providing a first substrate having a top face, opposite bottom face, and a plurality of sides, and contact elements formed on a top surface of the first substrate, restraining the first substrate in a fixture at room temperature, and wherein the fixture engages the sides of the first substrate, placing a flip chip on the substrate so that electrically conductive bumps on the flip chip are aligned with contact elements on the first substrate, heating the flip chip, first substrate and fixture to reflow the electrically conductive bumps on the flip chip, cooling the flip chip, first substrate and fixture to solidify the electrically conductive bumps and to mount the flip chip to the first substrate, depositing an underfill between the flip chip and the first substrate, curing the underfill by heating the underfill to an elevated temperature, and removing the flip chip mounted substrate from the fixture.

In another embodiment of the present invention, the flip chip, first substrate and fixture are heated to a temperature greater than 200° C. to reflow the electrically conductive bumps.

In another embodiment of the present invention the underfill is heated to a temperature greater than 120° C. to cure the underfill.

In another embodiment of the present invention includes a method including the steps of providing a flip chip mounted on a first substrate having a top face, bottom face, and a plurality of sides, restraining the first substrate in a fixture at room temperature, and wherein the fixture engages the sides of the first substrate, depositing an underfill between the flip chip and the first substrate, curing the underfill by heating the underfill to an elevated temperature, and removing the flip chip mounted substrate from the fixture.

In another embodiment of the present invention, the underfill is heated to temperature ranging from 120–170° C.

These and other objects, features, and advantages of the present invention will become apparent from the following brief description of the drawings, detailed description of the preferred embodiments, and appended claims and drawings.

DETAILED DESCRIPTION OF THE PREFERRED EMBODIMENTS

Figure 3:
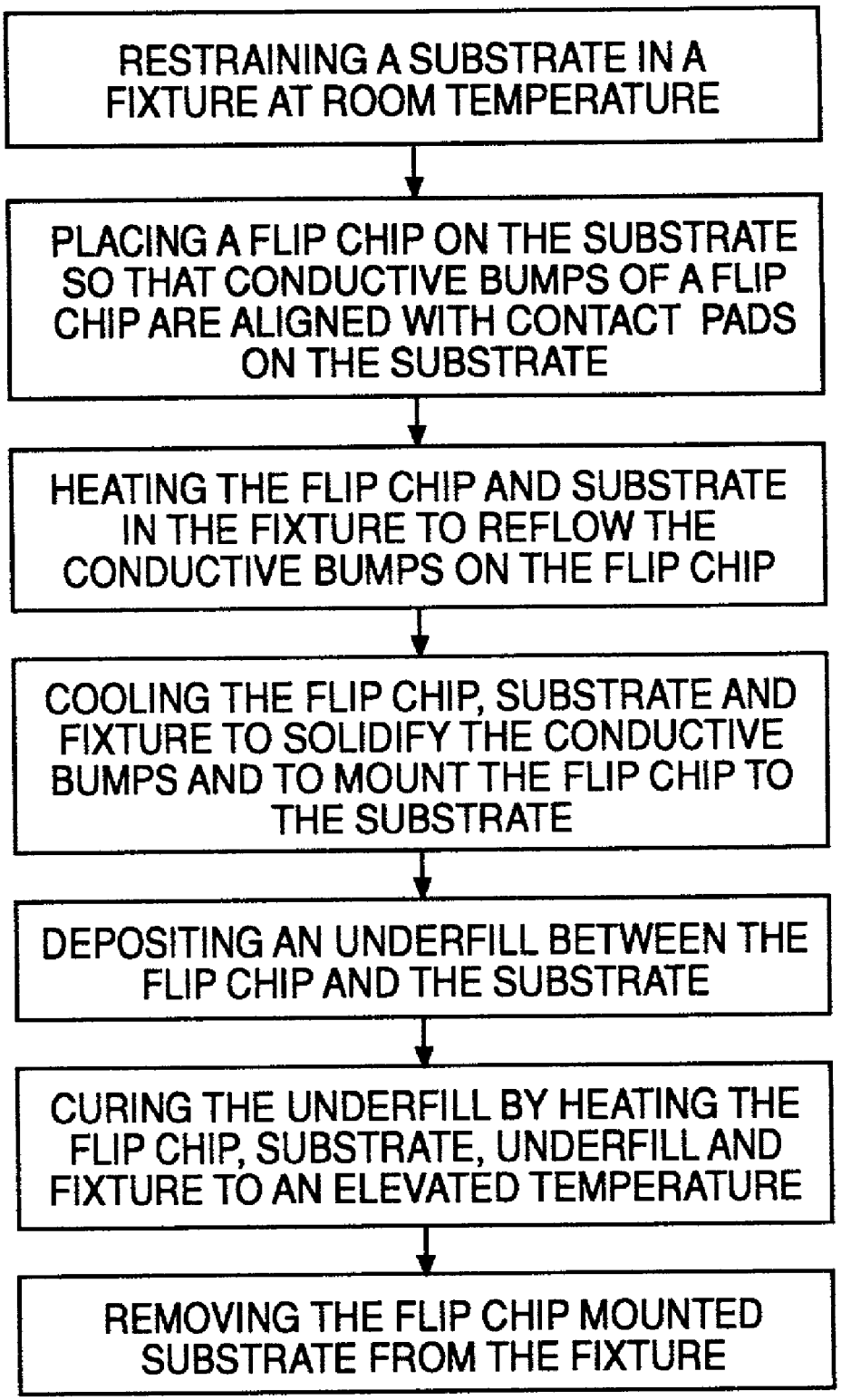
FIG. 3 is a process flow chart illustrating the major steps in a method of making a microelectronic assembly according to the present invention.

FIG. 3 is a process flow chart illustrating the major steps of a method of making a microelectronic assembly according to the present invention. The method according to the present invention includes the steps of: (1) restraining a substrate in a fixture at room temperature, (2) placing a flip chip on the substrate so that conductive bumps of the flip chip are aligned with contact pads on the substrate, (3) heating the flip chip, substrate and the fixture to reflow the conductive bumps on the flip chip, (4) cooling the flip chip, substrate and fixture to solidify the conductive bumps and to mount the flip chip to the substrate, (5) and depositing an underfill between the flip chip and the substrate, (6) curing the underfill by heating the flip chip, substrate, underfill and fixture to at elevated temperature, and (7) removing the flip chip mounted substrate. Other process steps in a method of making a microelectronic assembly according to the present invention will become apparent from the following description.

Figure 1:
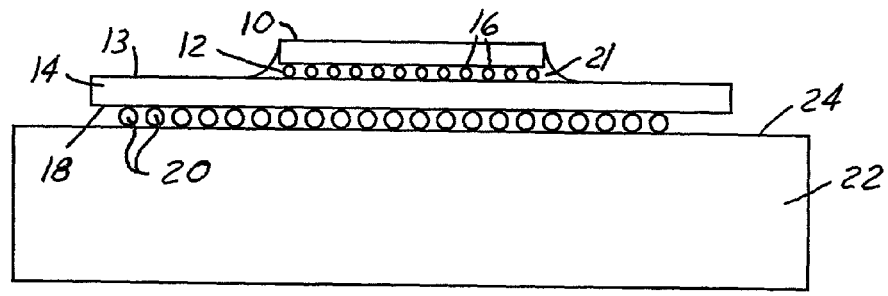
FIG. 1 illustrates a prior art microelectronic assembly including a fully arrayed flip chip mounted on a ball grid array that is attached to a printed circuit board.
Figure 2:
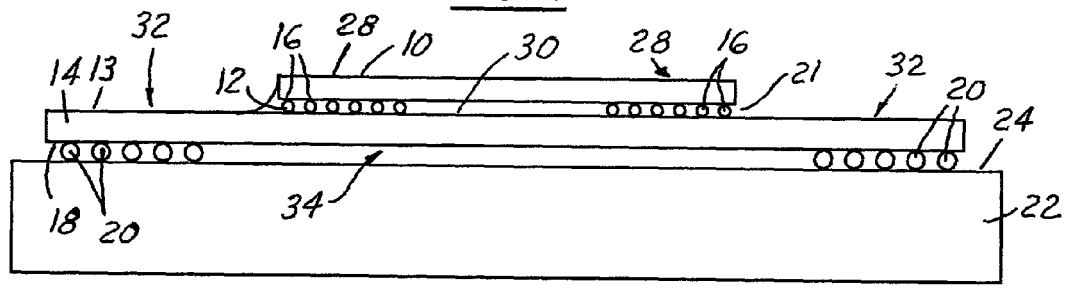
FIG. 2 illustrates a prior art microelectronic assembly including a periphery bumped flip chip mounted on the ball grid array that is attached to a printed circuit board.
Figure 4:
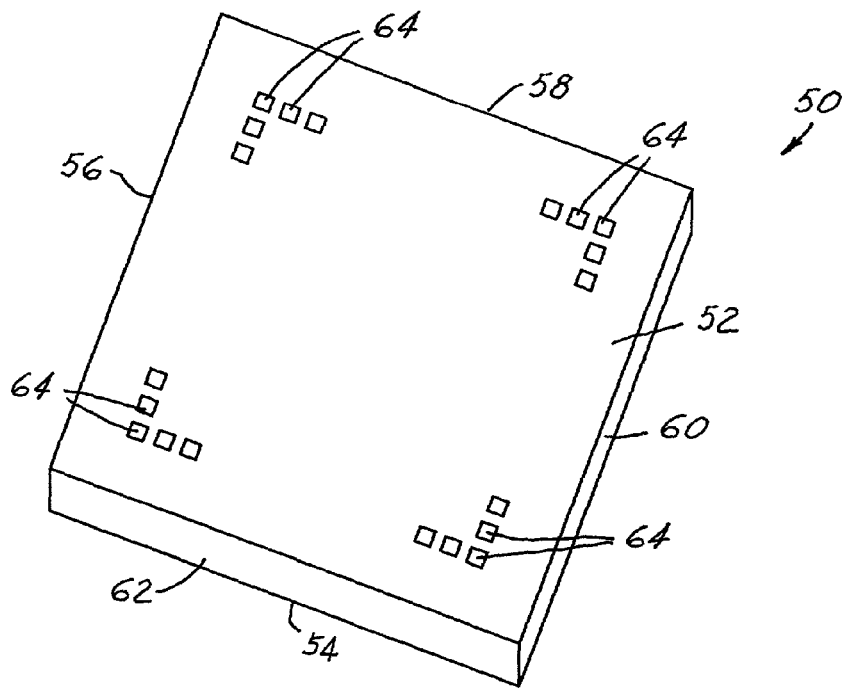
FIG. 4 illustrates a substrate having contact pads thereon used in a method of making a microelectronic assembly according to the present invention.

FIG. 4 illustrates a first substrate 50 used in making a microelectronic assembly according to the present invention. The first substrate 50 includes a top face 52 an opposite bottom face 54 and a plurality of sides 56, 58, 60, and 62. The top and bottom faces 52, 54 are substantially flat and the sides 56, 58, 60, and 62 are substantially narrower than the top and bottom faces 52, 54. Electrically conductive contacts such as contact pads 64 are formed on the top face 52 of the first substrate 50. The first substrate 50 may be a ball grid array and include a plurality of electrically conductive bumps such a solder bumps (not shown) on the bottom face 54 in a manner known to those skilled in art.

Figure 5:
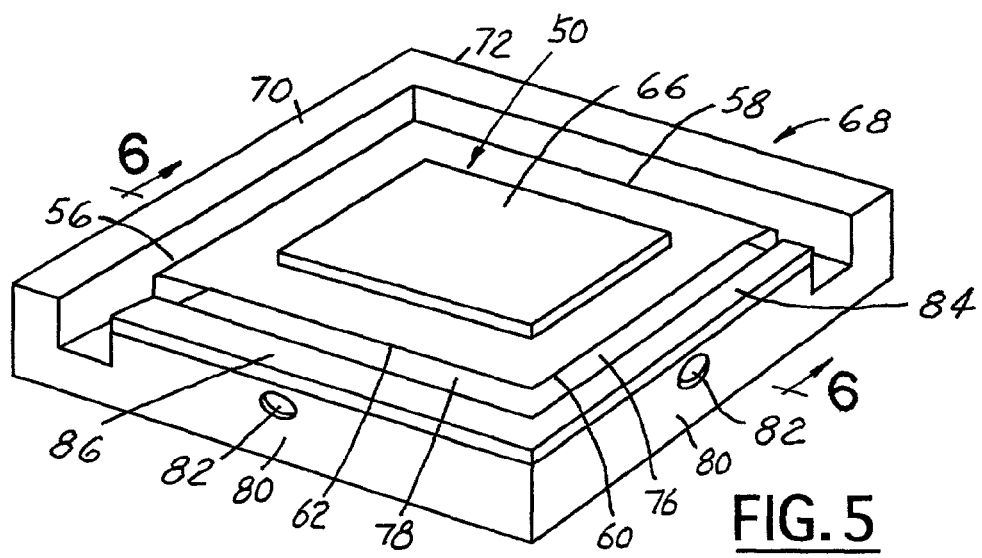
FIG. 5 is a perspective view of a microelectronic assembly in a clamping fixture according to the present invention.
Figure 6:
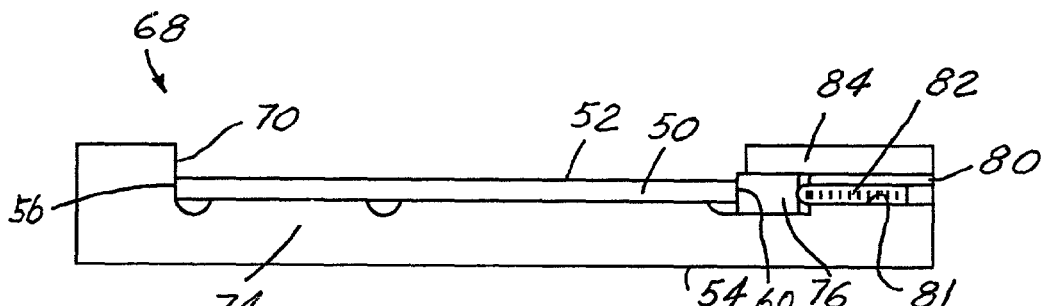
FIG. 6 is a sectional view, taken along line 6—6 of FIG. 5, of a substrate clamped in a clamping fixture according to the present invention.

FIG. 5 illustrates a microelectronic assembly including a flipped integrated circuit chip 66 mounted on the underlying first substrate 50, and wherein the first substrate 50 is restrained in a fixture 68. The fixture 68 includes a substrate carrying member such as a pedestal 74 (best seen in FIGS. 6–7) for supporting the first substrate 50. The fixture 68 also includes a plurality of substrate restraining members designed to engage the periphery of the first substrate 50 along its sides 56, 58, 60 and 62. As shown in FIG. 6, a first set of restraining members includes a first and second stationary stop 70, 72 that each rise above a substrate carrying member or pedestal 74 and each being constructed and arranged to engage a side of the first substrate 50. The first and second stops 70, 72 are stationary relative to the pedestal 74. Preferably the first and second stationary stops 70, 72 are formed at right angles to each other to match two adjacent sides 56, 58 of a square or rectangular shaped first substrate 50. However, the first substrate 50 may have a variety of shapes and configurations such as a rough disc shape. The restraining members would be constructed to accommodate the shape of the first substrate 50. The fixture 68 also includes two movable restraining members such as a first and a second movable substrate clamp 76, 78. The first and second movable substrate clamps 76, 78 are designed to move in and out of engagement with respective side 60, 62 of the first substrate 50. Preferably, the first and second substrate clamps 76, 78 are formed at right angles to each other corresponding to adjacent sides 60, 62 of a square or rectangular shaped first substrate 50. A substrate fixture base 80 is provided and connected to the platform 74. A threaded hole 81 extends through the substrate fixture base 80 for receiving a screw 82 that is connected to one of the movable substrate clamp 76, 78, for advancing the substrate clamp towards a side of the first substrate 50 and thereby restraining the substrate against an oppositely positioned stationary stop 70 or 72. Clamp guide plates 84, 86 are provided and secured to the substrate fixture base 80 and each overlies at least a portion of a respective movable substrate clamp 76, 78. Preferably the fixture, including all of its components, is made from a metal having a coefficient of thermal expansion of about 4–10 ppm/° C.

Any fixture which engage at least a portion and preferably all of the entire length of each side of the first substrate 50 may be used in the method of the present invention. The present invention is not limited to the specific fixture shown in the drawings, and may utilize a simple ring type clamping fixture to engage and restrain the sides of the first substrate 50.

Figure 7:
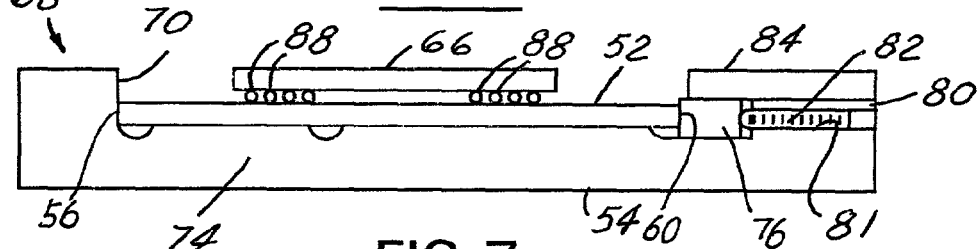
FIG. 7 is a sectional view of a flip chip being mounted on a restrained substrate in the clamping fixture and solder bumps reflown according to the present invention.

As will be appreciated from FIG. 6, according to the present invention the first substrate 50 is placed in the fixture 68 at room temperature and so that the first substrate 50 abuts the first and second stationary stops 70, 72. The screws 82 are advanced so that the movable substrate clamps 76, 78 each engages a respective side of the first substrate to firmly hold the substrate in the fixture. As shown in FIG. 7, thereafter an integrated circuit chip 66 with electrically conductive bumps, which may be copper, gold, silver, nickle but preferably are solder bumps 88 attached thereto is aligned with the contact pads 64 and placed on the first substrate 50. The first substrate 50, integrated circuit chip 66 and fixture 68 are heated to an elevated temperature to reflow the electrically conductive bumps (solder bumps) 88. For a 67/37 lead-tin solder composition it is typical to heat the solder to greater than 200° C. in order to reflow the solder. Thereafter, the integrated circuit chip 66, first substrate 50, and fixture 68 are cooled to solidify the electrically conductive bumps 88 and mount the chip 66 to the first substrate 50.

Figure 8:
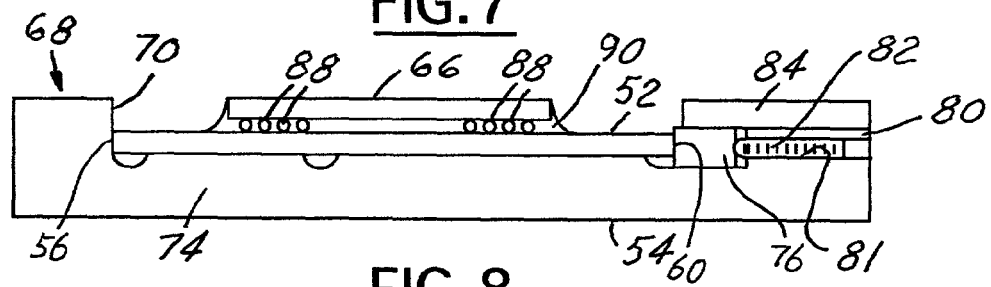
FIG. 8 is a sectional view of a flip chip mounted on the restrained substrate with a cured underfill between the flip chip and the substrate according to the present invention.
Figure 9:
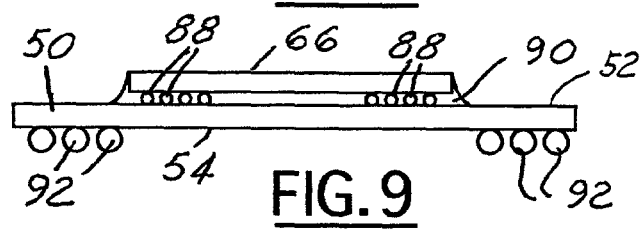
FIG. 9 is a side view of a flip chip mounted on a prestressed substrate according to the present invention.

As shown in FIG. 8, an underfill 90 is deposited between the integrated circuit chip 66 and the top face 52 of the first substrate 50. The underfill may include, but is not limited to, epoxies, polyimides or other thermoplastic or thermoset materials with and without filler additives. Thereafter, the integrated circuit chip 66, underfill 90, first substrate 50, and the fixture 68 are all heated to an elevated temperature to cure the underfill. A variety of suitable underfills are known to those skilled in the art and may include, for example, an epoxy with additive fillers. For such an underfill, it is typical to the heat the underfill to a temperature ranging from 120–170° C. to cure the underfill. Thereafter, the fixture 68 is removed to provide a microelectronic assembly. FIG. 9 shows a microelectronic assembly manufactured from the process according to the present invention wherein the first substrate 50 is a ball grid array including a second set of electrically conductive bumps such as solder bumps 92 attached to the bottom face 54 of the first substrate 50. The present method of making a microelectronic assembly is particularly applicable to peripheral bump flip chips wherein the bump joint thermal-mechanical stresses can be eliminated and high assembly yields can be achieved without having fully array bumps and increased layers and cost of a fully arrayed structure.

What is claimed is:

1. A method comprising:

making a microelectronic device comprising providing a first substrate having a top face, opposite bottom face, and a plurality of sides, and contact elements formed on the top face of the first substrate;

inducing stresses in the first substrate comprising:

firmly restraining the first substrate in a fixture at room temperature, and wherein the fixture engages the sides of the first substrate;

placing a flip chip on the first substrate so that electrically conductive bumps of the flip chip are aligned with the contact elements on the substrate;

heating the flip chip, first substrate and the fixture to reflow the electrically conductive bumps on the flip chip;

cooling the flip chip, first substrate and fixture to solidify the electrically conductive bumps and to mount the flip chip to the first substrate;

removing the flip chip mounted substrate from the fixture;

wherein the fixture comprises a plurality of substrate restraining members each for engaging one of the sides of the first substrate, and wherein the plurality restraining members have a coefficient of thermal expansion ranging from 4–10 ppm/° C., and wherein the step of restraining the first substrate is preformed by the plurality of substrate restraining member;

wherein the plurality of restraining members includes a first and a second elongated stationary stop, and a first and a second movable clamp;

wherein the fixture further comprises a substrate fixture base having first and second threaded holes formed therethrough, a screw received in each of the holes and the screw having one end connected to one of the first and second movable clamp and constructed and arranged so that tightening the screw causes the movable clamp to engage a side of the first substrate.

2. A method as set forth in claim 1 wherein the electrically conductive bumps comprise solder.

3. A method as set forth in claim 1 wherein the step of heating the flip chip, first substrate and electrically conductive bumps is conducted to heat the bump to greater than 200° C.

4. A method as set forth in claim 1 further comprising the step of depositing an underfill between the flip chip and the first substrate, and curing the underfill.

5. A method as set forth in claim 4 wherein the step of curing the underfill comprises heating the underfill to an elevated temperature.

6. A method as set forth in claim 5 wherein the elevated temperature is greater than 120° C.

7. A method as set forth in claim 1 wherein the fixture comprises a metal.

8. A method as set forth in claim 1 wherein the plurality of restraining members comprises a metal.

9. A method as set forth in claim 1 wherein the fixture further comprises a substrate carrying member for supporting the first substrate along the bottom face.

10. A method as set forth in claim 1 wherein each of the restraint members respectively engages one of the sides along substantially the entire length of the side.

11. A method as set forth in claim 1 wherein the first and second elongated stationary stops are formed at right angles to each other.

12. A method as set forth in claim 1 wherein the first substrate comprises a ball grid array.

13. A method as set forth in claim 1 wherein the fixture further comprises a clamp guide plate overlying each of the first and second movable clamp.

* * * * *